United States Patent [19]

Steigerwald

[11] Patent Number: 5,010,261
[45] Date of Patent: Apr. 23, 1991

[54] LOSSLESS GATE DRIVER CIRCUIT FOR A HIGH FREQUENCY CONVERTER

[75] Inventor: Robert L. Steigerwald, Burnt Hills, N.Y.

[73] Assignee: General Electric Company, Schenectady, N.Y.

[21] Appl. No.: 447,947

[22] Filed: Dec. 8, 1989

[51] Int. Cl.$^5$ .................. H03K 17/687; H03K 19/017
[52] U.S. Cl. .................... 307/571; 307/584; 307/585; 307/451; 307/448
[58] Field of Search .............. 307/270, 451, 452, 585, 307/490, 494, 498, 572, 579, 262, 571, 584, 633, 642; 363/132, 21, 18, 97, 126; 323/222, 27; 328/113, 123

[56] References Cited

U.S. PATENT DOCUMENTS

| | | | |
|---|---|---|---|
| 4,224,535 | 9/1980 | Wilson et al. | 307/254 |
| 4,492,881 | 1/1985 | Anderson et al. | 307/254 |
| 4,575,642 | 3/1986 | Hochreutiner et al. | 307/246 |
| 4,612,451 | 9/1986 | Maekawa et al. | 307/284 |
| 4,626,715 | 12/1986 | Ishii | 307/254 |
| 4,783,601 | 11/1988 | Hartgring et al. | 307/270 |
| 4,791,321 | 12/1988 | Tanaka et al. | 307/296.5 |
| 4,825,101 | 4/1989 | Walters, Jr. | 307/263 |
| 4,845,389 | 7/1989 | Pyndiah et al. | 307/572 |
| 4,845,605 | 7/1989 | Steigerwald | 363/21 |

OTHER PUBLICATIONS

W. A. Tabisz et al., "Zero-Voltage-Switched Quasi-Resonant Buck and Flyback Converters—Experimental Results at 10 MHz", Power Electronics Specialists Conference Record, pp. 404–413.

*Primary Examiner*—Stanley D. Miller
*Assistant Examiner*—Toan Tran
*Attorney, Agent, or Firm*—Jill M. Breedlove; James C. Davis, Jr.; Marvin Snyder

[57] ABSTRACT

A high efficiency gate driver circuit for driving a power switching device of a high frequency converter includes a series resonant circuit for making resonant transfers of energy between the input capacitance of the power switching device and a storage capacitor to achieve substantially lossless gate switching. An ac switch couples the resonant circuit to the junction between upper and lower switching devices connected in a half-bridge configuration. The upper and lower switches of the half-bridge function to maintain the power switching device in either an ON-state or an OFF-state, respectively, depending on the transfer of energy being made. Timing circuitry ensures proper gating of the switching devices relative to operation of the ac switch.

15 Claims, 5 Drawing Sheets

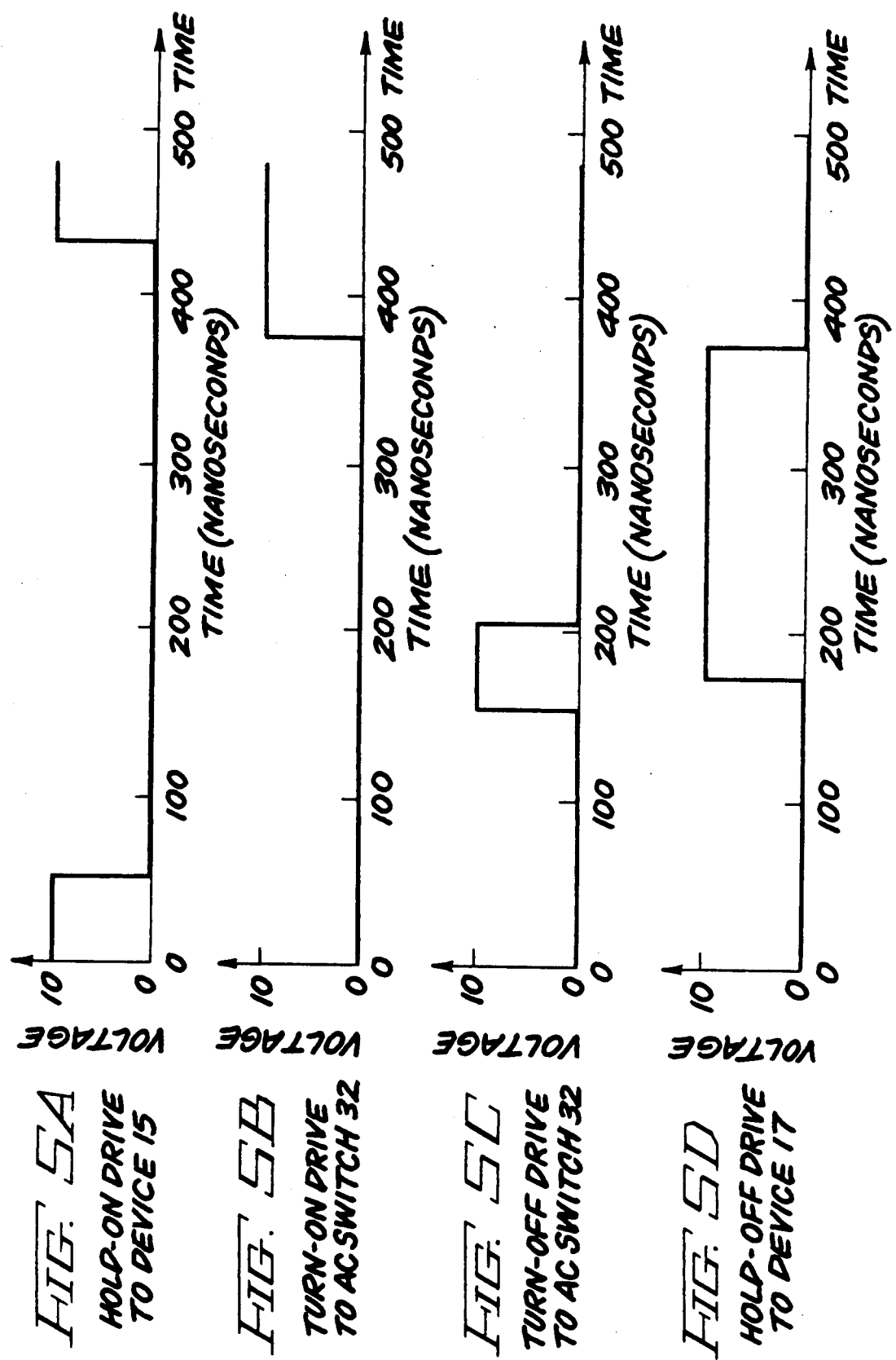

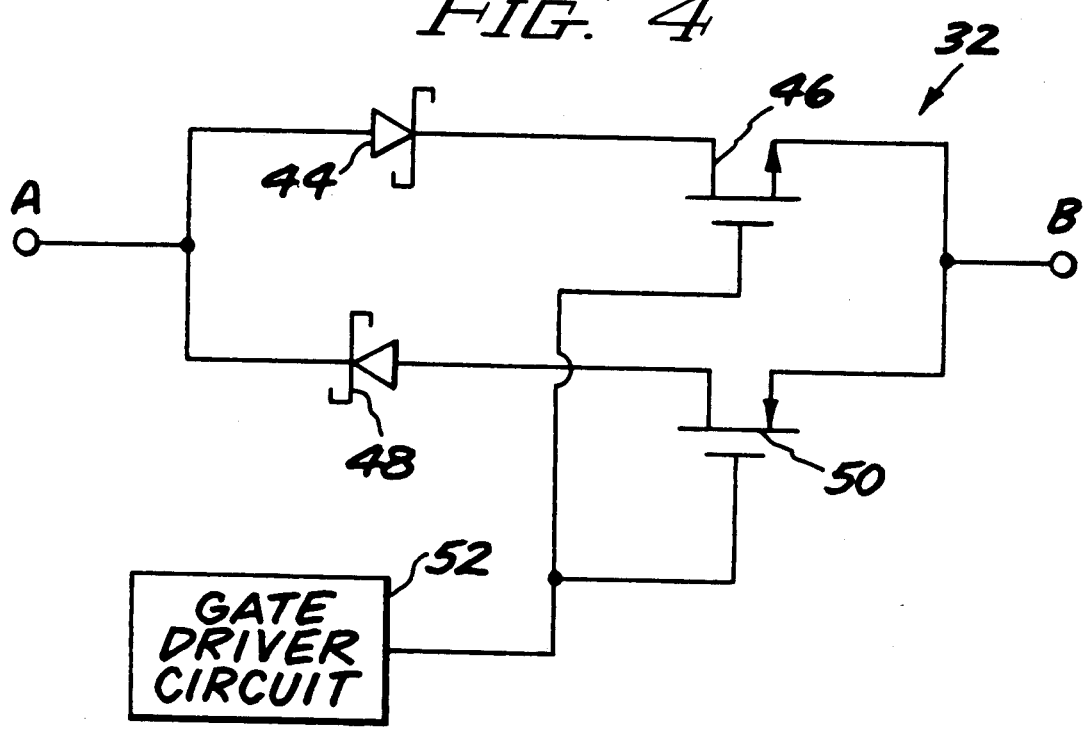

LOSSLESS GATE DRIVER CIRCUIT FOR A HIGH FREQUENCY CONVERTER

FIELD OF THE INVENTION

This invention was made with Government support under contract N66001-87-C-0378 awarded by the Department of the Navy. The Government has certain rights in this invention.

The present invention relates generally to high-frequency power converters. More particularly, the present invention relates to a lossless gate driver circuit for driving a power switching device of a high frequency power converter.

BACKGROUND OF THE INVENTION

A conventional gate driver circuit used for driving a power switching device of a power converter utilizes semiconductor switching devices to turn on the power switching device and to discharge an input capacitance thereof when the power switching device is turned off. Such a conventional power switching device driver circuit loses approximately twice the energy stored in the device's input capacitance each time the device switches through an on and off cycle. Furthermore, as the operating frequency of the converter increases, power dissipation in the switching devices also increases. However, by operating the power converter at higher frequencies, smaller reactive components can be used, resulting in a smaller power supply. Thus, there is a tradeoff between power supply efficiency and size.

A concurrently filed R. L. Steigerwald U.S. patent application Ser. No. 447,948, now allowed U.S. Pat. No. 4,967,109 discloses and claims a gate driver circuit which reduces gate switching losses by approximately one-half as compared with a conventional driver. In that driver circuit, an inductance is situated in series with the two switching devices of a half-bridge driver, and a Schottky diode is coupled in series between the upper switching device and the gate-drive power supply. During turn-on of the power switching device, the voltage across the power device input capacitance resonates to approximately twice the amplitude of the gate drive power supply. Advantageously, therefore, the gate drive supply voltage is required to be only one-half the desired input capacitance voltage. The only gate switching losses during turn-on are due to the resistances of the nonideal circuit elements. The input capacitance is prevented from discharging to the supply by the Schottky diode. As in conventional drivers, when the power device is turned off, the input capacitance discharges through the lower switching device of the half-bridge. Hence, since turn-on gate losses are substantially zero, the only significant gate switching losses occur during device turn-off so that gate switching losses are reduced from their expected amount by approximately one-half.

OBJECTS OF THE INVENTION

An object of the present invention is to provide a new and improved gate driver circuit for driving a power switching device of a power converter.

Another object of the present invention is to provide a high efficiency gate driver circuit for driving a power switching device of a high frequency power converter which is small in size.

Still another object of the present invention is to provide a switching device driver circuit for a power converter which substantially eliminates gate switching losses during both turn-on and turn-off of the power switching device.

SUMMARY OF THE INVENTION

The foregoing and other objects of the present invention are achieved in a new and improved gate driver circuit for driving a power semiconductor switching device of a high frequency power converter. The new driver circuit comprises two switching devices which are connected in a half-bridge configuration. A series resonant circuit, including an inductor and a storage capacitor, is coupled to the two switching devices by an ac switch. In accordance with the present invention, by making resonant transfers of energy between the series resonant circuit and the power switching device, the new driver circuit accomplishes substantially lossless switching of the gate of the power switching device.

In order to turn off the power switching device, the ac switch is turned on so that the energy stored in the input capacitance of the power switching device discharges resonantly through the inductor and the storage capacitor. The storage capacitor voltage thus resonates up to approximately the value of the voltage that was across the input capacitance of the power switching device just before turn-off. The ac switch is opened at the end of the energy transfer, after which the lower switching device of the half-bridge is turned on to ensure that the power switching device remains off. In order to turn on the power switching device again, the ac switch is closed, causing resonant transfer of the energy stored in the storage capacitor back into the input capacitance of the power switching device. The ac switch is then opened, after which the upper switching device of the half-bridge is turned on to ensure that the power switching device remains on.

BRIEF DESCRIPTION OF THE DRAWINGS

The features and advantages of the present invention will become apparent from the following detailed description of the invention when read with the accompanying drawings in which:

FIG. 4 is a schematic diagram of a preferred implementation of an ac switch useful in the gate driver circuit of FIG. 2; and FIGS. 5A-D is a timing diagram illustrating appropriate gate drive timing for the driver circuit of FIG. 2 employing the ac switch of FIG. 4.

DETAILED DESCRIPTION OF THE INVENTION

Figure 1:
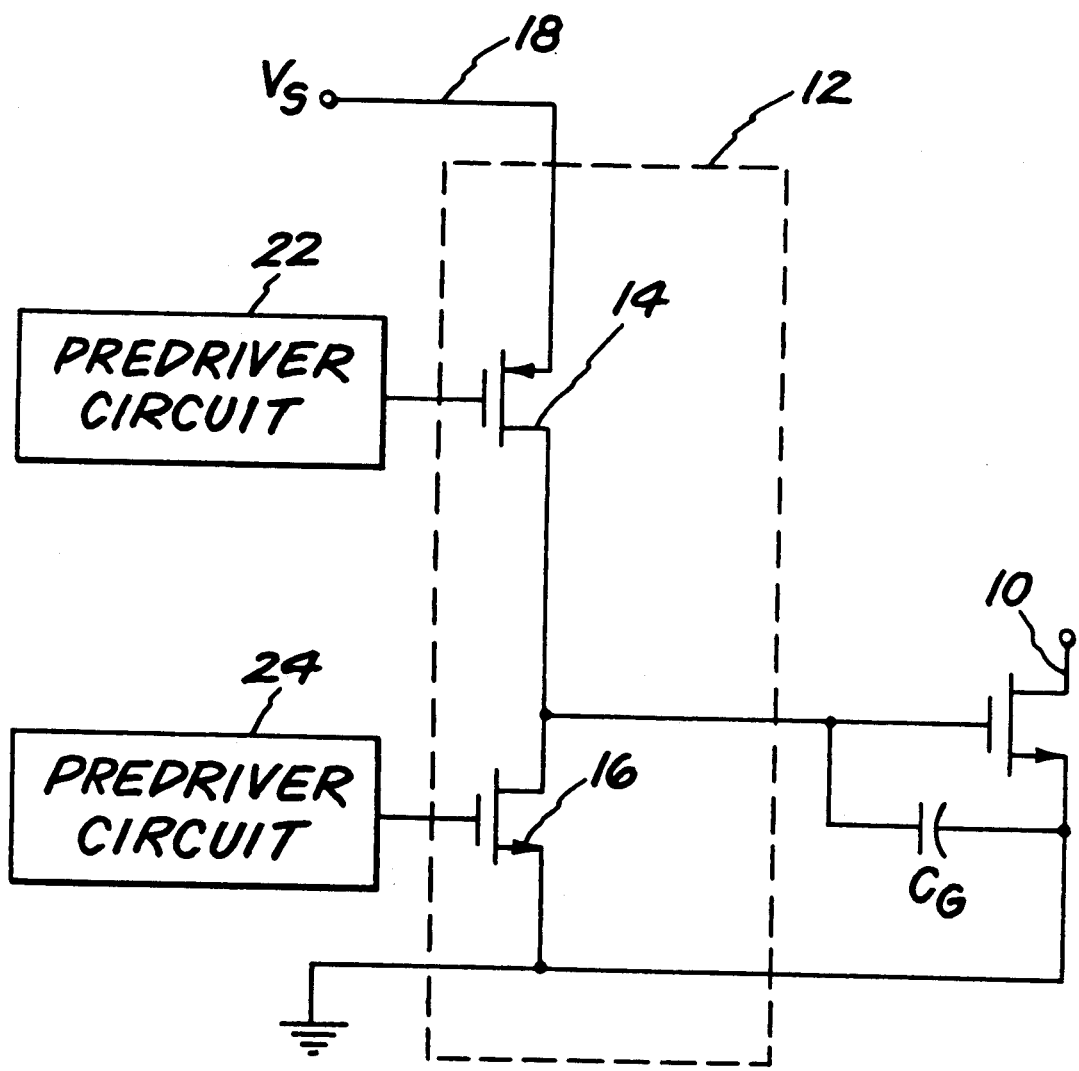
FIG. 1 is a schematic diagram of a conventional gate driver circuit for driving a power MOSFET of a power converter.

A conventional gate driver circuit 12 for driving a power switching device 10 of a power converter (not shown) is illustrated in FIG. 1. The power converter may be of any type known in the art which employs power semiconductor switching devices which have capacitive gates and generate an output voltage from segments of an input signal, thereby converting ac power to dc, dc power to ac, or dc power to dc, as desired. The power switching device 10 shown in FIG. 1 may comprise, for example, the single primary-side power switching device of a single-ended power supply. Single-ended converters are described in commonly assigned U.S. Pat. No. 4,845,605 of R. L. Steigerwald, issued on July 4, 1989, which patent is hereby incorporated by reference.

The conventional driver 12 of FIG. 1 comprises two semiconductor switching devices 14 and 16 connected in series in a half-bridge configuration between a positive conductor 18 at the potential of the gate drive voltage supply $V_s$ and ground. The power switching device 10 is illustrated as a MOSFET, but any other type of switching device which has a capacitive gate may be used, such as an insulated gate bipolar transistor (IGBT) or a MOS-controlled thyristor (MCT). Switching devices 14 and 16 are also illustrated in FIG. 1 as MOSFET's, but any suitable bidirectional switching device may be used, including bipolar junction transistors (BJT's). Therefore, it is by way of example only that device 14 is illustrated as a p-channel type MOSFET and device 16 is illustrated as an n-channel type MOSFET.

To turn on the power switching device 10, a predriver circuit 22 of a type well-known in the art, such as a type DS0026 driver manufactured by National Semiconductor Corporation, provides a turn-on signal to the gate of device 14 which, in turn, provides a turn-on signal to the gate of the power MOSFET 10. The input capacitance $C_G$ of power MOSFET 10 charges through device 14 to approximately the gate drive supply voltage level $V_s$. Since the device 14 acts essentially as a resistance while it is conducting, power is dissipated as the input capacitance charges. The amount of energy E dissipated is given by:

$$E = \tfrac{1}{2} C_G V_s^2$$

Similarly, when device 16 is turned on by a predriver circuit 24 (and device 14 is off), the input capacitance $C_G$ discharges through device 16 which acts as a resistance to dissipate substantially the same amount of power given by the equation for energy E above. Therefore, the total amount of energy $E_T$ dissipated during each cycle of switching on and off power MOSFET 10 is given by:

$$E_T = C_G V_s^2$$

Figure 2:
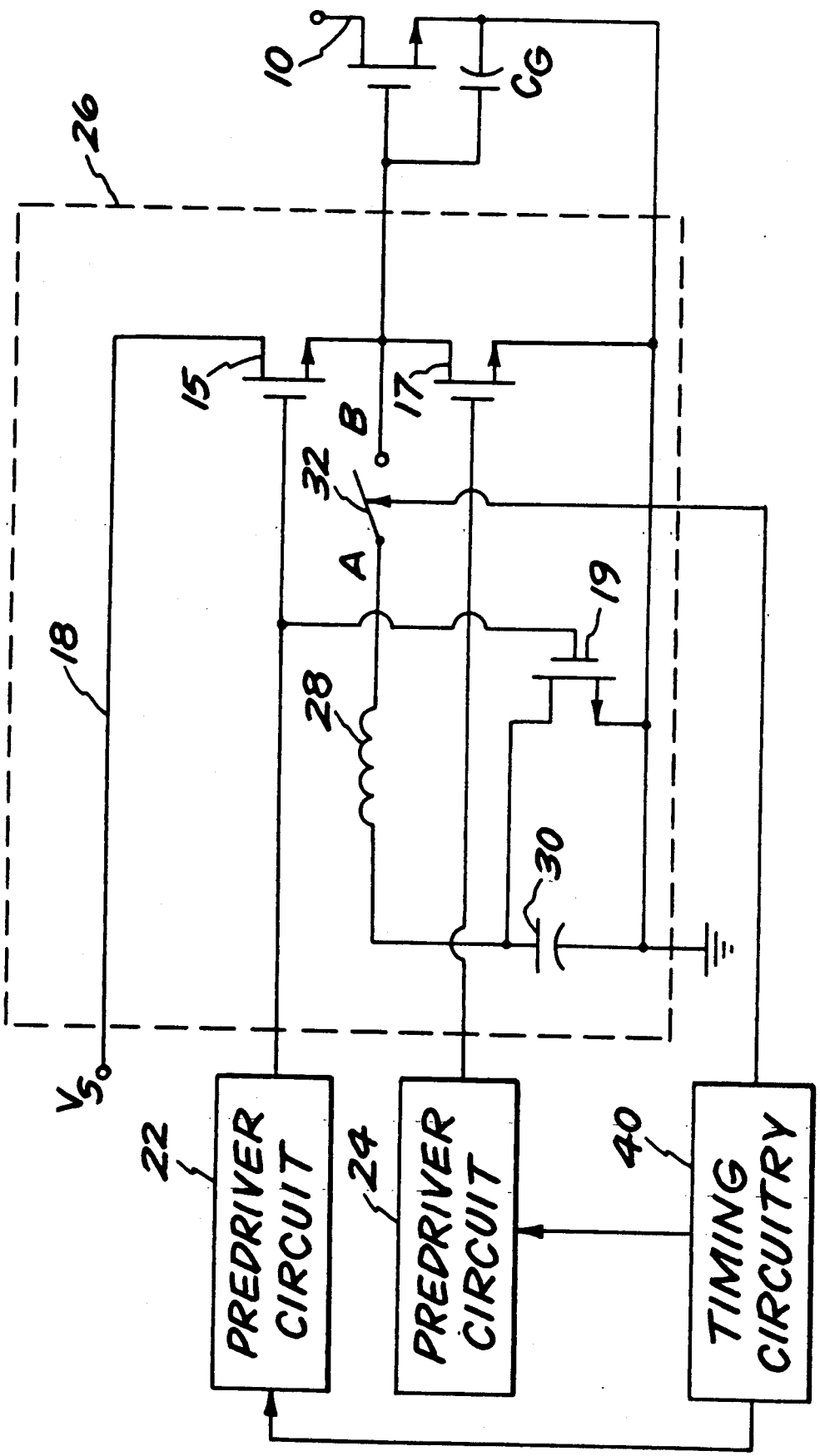
FIG. 2 is a schematic diagram of a gate driver circuit according to a preferred embodiment of the present invention useful for driving a power MOSFET such as that of FIG. 1.

FIG. 2 illustrates an improved gate driver circuit 26, according to a preferred embodiment of the present invention, which is useful for driving a power switching device of a power converter, such as power MOSFET 10. A series resonant circuit comprising an inductance 28 and a storage capacitor 30 is coupled to devices 15 and 17 of the half-bridge at the junction therebetween by an ac switch 32. Another bidirectional switching device 19 is connected in parallel with storage capacitor 30. Inductance 28 can be implemented, for example, by an inductor having an inductance value in the range of approximately 10 to 20 nanohenries. Such an inductor 28 can be formed from one or two turns of wire having a one centimeter diameter. Advantageously, the inductor lead wires can provide a substantial portion of the desired inductance value Moreover, devices 15 and 17 need not be high current switching devices, in contrast to devices 14 and 16 of the conventional driver circuit, because their function is primarily to hold power MOSFET 10 on or off, as will be described hereinafter.

In operation, resonant transfers of energy are made between the power switching device 10 and the series resonant circuit in a manner to achieve substantially lossless gate driver switching. The capacitance of the storage capacitor and the input capacitance of the power MOSFET are preferably equivalent so that these capacitances resonate between substantially the same voltage levels. When the voltage level across the input capacitance $C_G$ is high, i.e. at approximately the level $V_s$, power device 10 is turned off by closing ac switch 32 so that the gate energy is resonantly discharged through inductor 28 into storage capacitor 30. As a result, the voltage across storage capacitor 30 resonates up to approximately the level $V_s$. After the energy transfer is complete, ac switch 32 is opened. Thereafter, lower switching device 17 is turned on to ensure that power MOSFET 10 remains off, and to ensure that the input capacitance voltage decreases to zero, thereby compensating substantially for any gate losses occurring due to nonideal, i.e. resistive, circuit elements during the resonant transfer of energy.

In order to turn on power MOSFET 10, ac switch 32 is closed, and the energy stored in storage capacitor 30 is transferred resonantly through inductor 28 to the input capacitance $C_G$ of power MOSFET 10. After the energy transfer, ac switch 32 is again opened. Thereafter, upper switching device 15 is turned on to ensure that power MOSFET 10 remains on and to ensure that the input capacitance voltage on power MOSFET 10 again rises to the value $V_s$, thereby compensating substantially for any gate losses occurring during the resonant transfer of energy.

Figure 3A:
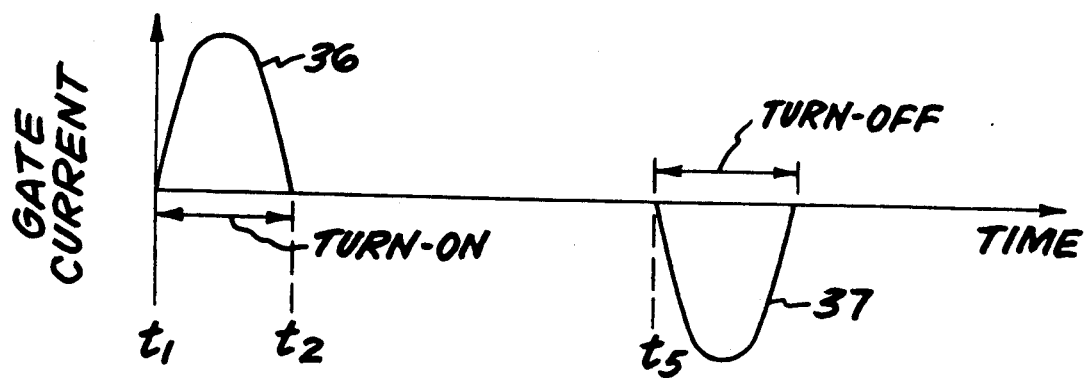
FIGS. 3A, 3B, and 3C are graphical illustrations of current and voltage waveforms useful in describing the operation of the driver circuit of FIG. 2.
Figure 3B:
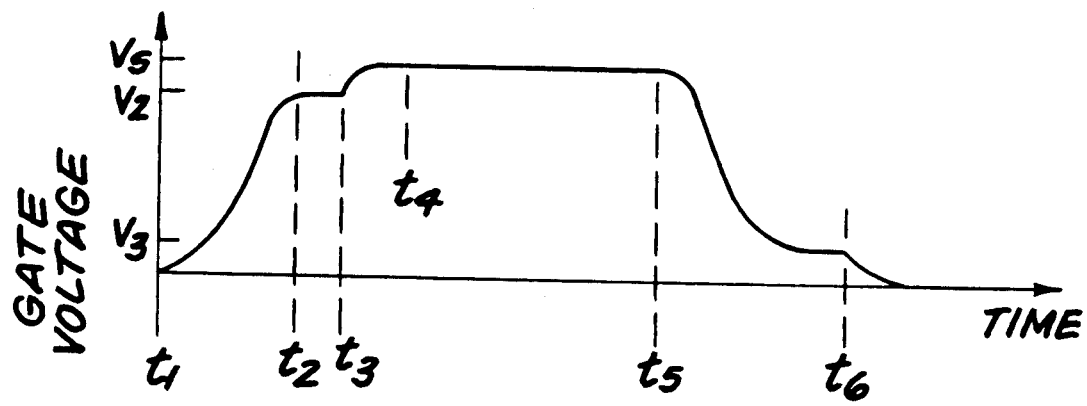
Figure 3C:
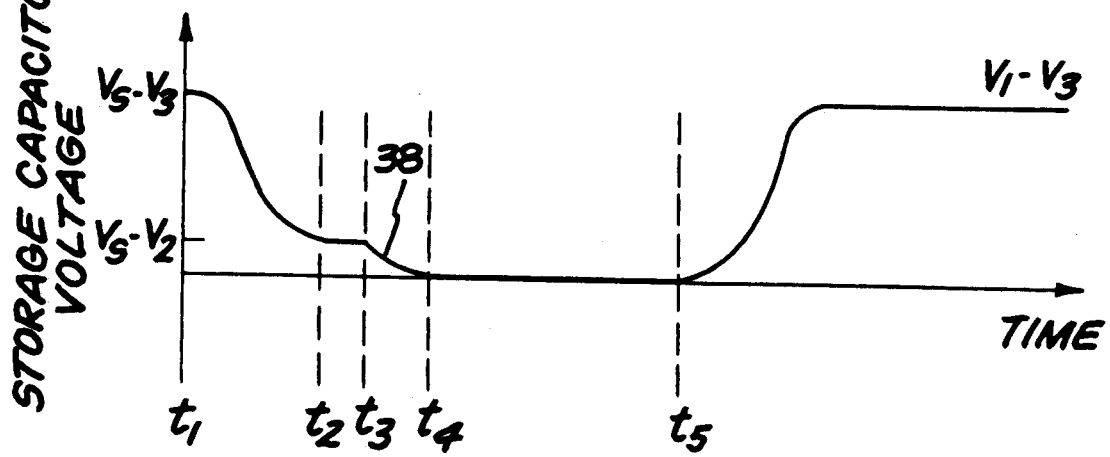

FIGS. 3A and 3B graphically illustrate the gate current and gate (i.e. input capacitance) voltage, respectively, for MOSFET 10 of FIG. 2, while FIG. 3C is a graph of the storage capacitor voltage for the gate driver circuit of FIG. 2. In FIG. 3A, the area under curve 36 represents the charge stored on input capacitance $C_G$ after power MOSFET 10 is turned on, and the substantially equal area under curve 37 represents the amount of charge that is removed from the input capacitance after power MOSFET 10 is turned off.

As shown in FIG. 3B, during turn-on of power MOSFET 10, while ac switch 32 is closed, starting at time $t_1$, the gate voltage increases to a level $V_2$. After the energy transfer, ac switch 32 is opened at time $t_2$. Thereafter, upper switching device 15 is turned on at time $t_3$ so that the gate voltage increases to the level $V_s$, thereby compensating for resistive losses that are due to nonideal circuit elements, which dampen the resonant energy transfers. Some time $t_4$ after voltage Vs is reached, and before power MOSFET 10 is turned off, upper switching device 15 is turned off.

During turn-off of power MOSFET 10, while ac switch 32 is again closed at time $t_5$, the gate voltage decreases to a level $V_3$ as the input capacitance $C_G$ discharges. Thereafter, ac switch 32 is turned off and lower switching device 17 is turned on at time $t_6$ so that the gate voltage decreases to zero, thereby compensating for resistive losses, as described hereinabove. Lower switching device 17 then will be turned off before the next turn-on interval of power MOSFET 10.

As shown in FIG. 3C, during turn-off of power MOSFET 10, the storage capacitor voltage reaches approximately a level $V_s - V_3$, which corresponds to the voltage decrease across the power MOSFET gate as the input capacitance $C_G$ discharges before turn-on of device 17, as shown in FIG. 3B. During turn-on of power MOSFET 10, the voltage level across storage capacitor 30 decreases from the level $V_S$-$V_3$ to a level $V_S$-$V_2$. This level $V_S$-$V_2$ corresponds to the voltage increase across the power MOSFET gate as the input capacitance $C_G$ charges before device 15 is turned on, as shown in FIG. 3B. The fall-off 38 in the voltage waveform of FIG. 3C is caused by turning on switching device 19 at time $t_3$ to bring the voltage across the storage capacitor down to zero, thereby compensating for resistive losses in nonideal circuit elements In this way, storage capacitor 30 is fully discharged, thus being ready to accept the resonant charging from the input capacitance $C_G$ when power MOSFET 10 is turned off. Some time $t_5$ after a zero voltage level across storage capacitor 30 is reached, switching device 19 is turned off. It is to be noted that in the preferred embodiment of FIG. 2, the gate of switching device 19 is connected to the gate of upper switching device 15 so that both devices are driven by the same predriver circuit 22.

In accordance with a preferred embodiment of the present invention, as illustrated in FIG. 2, timing circuitry 40 is required to ensure proper gating of the switching devices relative to operation of the ac switch in order to achieve substantially lossless gate switching. That is, timing circuitry 40 is required to provide a time delay between turning on ac switch 32 and turning on the upper and lower switching devices 15 and 17 in the sequences described hereinabove. Furthermore, timing circuitry is needed to coordinate the respective turn-off times of these devices. Suitable timing circuitry may comprise, for example, one-shot timers of a type well-known in the art to provide, for example, a delay on the order of 20 nanoseconds. Alternatively, logic gate delay circuitry may be used to provide the delay.

A preferred implementation of ac switch 32 is shown in FIG. 4. A series combination of a Schottky diode 44 and an n-channel type MOSFET 46 is connected in parallel between junctions A and B with a series combination of a Schottky diode 48 and a p-channel type MOSFET 50. By employing diodes 44 and 48, precise timing circuitry for opening ac switch 32 is not needed, since these diodes block voltage, thereby preventing any undesirable "ring back" of energy after a resonant energy transfer is complete When the storage capacitor 30 is charged to level $V_s$-$V_3$ so that the voltage at junction A is at level $V_s$-$V_3$, and gate driver circuit 52 applies a turn-on signal to the gate of device 46 which is positive with respect to the voltage at junction B (thereby holding p-type device 50 off), current flows through diode 44 to power MOSFET 10. On the other hand, when the input capacitance of power MOSFET 10 is fully charged to level $V_s$ and a turn-on signal is applied to the gate of MOSFET 50 which is negative with respect to the voltage at junction B (so that n-type device 46 is turned off), diode 48 is forward biased so that current flows from power MOSFET 10 to charge the storage capacitor 30.

FIG. 5 illustrates appropriate gate drive timing for the driver circuit of FIG. 2 employing the ac switch of FIG. 4. As shown, by using the ac switch of FIG. 4, the sequence of gating devices 15 and 17 with respect to ac switch 32, as described in detail hereinabove, need not be maintained, since this particular ac switch configuration ensures against any undesirable "ring back" of energy after each resonant transfer of energy.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. An efficient gate driver circuit for driving a semiconductor power switching device of a high-frequency power converter, said power switching device having an input capacitance, comprising:
   first and second switch means for coupling to a gate drive power supply and connected in series in a half-bridge configuration with a junction therebetween, the gate of said power switching device being coupled to said junction;
   ac switch means having two terminals, one of said terminals being coupled to said first and second switch means at said junction therebetween;
   resonant circuit means coupled to the other one of said terminals of said ac switch means for resonantly charging and discharging said input capacitance so as to result in substantially lossless gate driver switching, said ac switch means being operable to couple said series resonant circuit to said power switching device during the resonant charging and discharging of said input capacitance;
   said first switch means ensuring that said input capacitance is fully charged and said power switching device remains on before said ac switch means is activated in order to discharge said input capacitance; and
   said second switch means ensuring that said input capacitance is fully discharged and said power switching device remains off before said ac switch means is activated in order to charge said input capacitance.

2. The driver circuit of claim 1 wherein said resonant circuit means comprises a series resonant circuit including an inductance connected in series with a storage capacitor.

3. The driver circuit of claim 2 wherein the capacitance of said storage capacitor is substantially equivalent to said input capacitance.

4. The driver circuit of claim 2 further comprising a third switch means coupled in parallel with said storage capacitor for ensuring that said storage capacitor discharges substantially to zero after said power switching device is turned off.

5. The driver circuit of claim 1 wherein said power switching device comprises a MOSFET.

6. The driver circuit of claim 1 wherein said first and second switch means each comprises a semiconductor bidirectional switching device.

7. The driver circuit of claim 6 wherein each said semiconductor bidirectional switching device comprises a MOSFET.

8. The driver circuit of claim 4 wherein said first, second, and third switch means each comprises a semiconductor bidirectional switching device.

9. The driver circuit of claim 8 wherein each said semiconductor bidirectional switching device comprises a MOSFET.

10. The driver of claim 1 further comprising time delay means coupled to said ac switch means for providing a predetermined time delay after turning on said ac switch means and before turning on said first switch means.

11. The driver of claim 10 wherein said time delay means provides a second predetermined time delay after turning on said ac switch means and before turning on said second switch means.

12. The driver of claim 11 wherein said time delay means provides a third predetermined time delay after turning off said ac switch means and before turning off said first switch means.

13. The driver of claim 12 wherein said time delay means provides a fourth predetermined time delay after turning off said ac switch means and before turning off said second switch means.

14. The driver of claim 1 wherein said ac switch means comprises:

a first diode and a first switching device connected in series, the cathode of said first diode being coupled to the drain of said first switching device; and a second diode and a second switching device connected in series, the anode of said second diode being coupled to the drain of said second switching device, the series combination of said first diode and said first switching device being connected in an antiparallel relationship with the series combination of said second diode and said second switching device.

15. The driver of claim 14 wherein:

said first and second diodes each comprises a Schottky diode;

said first switching device comprises an n-channel type MOSFET; and said second switching device comprises a p-channel type MOSFET.

* * * * *